United States Patent [19]

Iwamoto

[11] Patent Number: 4,854,444
[45] Date of Patent: Aug. 8, 1989

[54] PRECISE FEEDING MECHANISM

[75] Inventor: Kazunori Iwamoto, Atsugi, Japan

[73] Assignee: Canon Kabushiki Kaisha, Tokyo, Japan

[21] Appl. No.: 271,365

[22] Filed: Nov. 14, 1988

Related U.S. Application Data

[63] Continuation of Ser. No. 875,302, Jun. 17, 1986, abandoned.

[30] Foreign Application Priority Data

Jun. 24, 1985 [JP] Japan ............................. 60-135945
Jun. 24, 1985 [JP] Japan ............................... 135946
Jun. 24, 1985 [JP] Japan ............................. 60-135947
Jun. 24, 1985 [JP] Japan ............................. 60-135948

[51] Int. Cl.$^4$ ............................................. B65G 25/04
[52] U.S. Cl. ..................................... 198/750; 269/21
[58] Field of Search ................... 198/341, 346.2, 468.9, 198/750, 751; 414/749, 750; 74/89.15; 108/137; 269/21, 27, 50; 310/328

[56] References Cited

U.S. PATENT DOCUMENTS

| 2,756,857 | 7/1956 | McCorkle | 414/749 X |
|---|---|---|---|
| 3,408,689 | 11/1968 | Heiner | 414/749 X |
| 3,413,865 | 12/1968 | Nimtz et al. | 474/109 |
| 3,525,140 | 8/1970 | Cachon | 29/200 |
| 3,604,570 | 9/1971 | Canner | 414/749 X |
| 3,790,155 | 2/1974 | Longamore | 108/137 X |
| 4,020,709 | 5/1977 | Brocchi | 74/89.15 |
| 4,042,119 | 9/1977 | Hassan | 414/749 |
| 4,130,205 | 12/1978 | Lüthi | 414/749 |
| 4,607,166 | 8/1986 | Tamaki | 310/328 X |

FOREIGN PATENT DOCUMENTS

| 1921707 | 1/1970 | Fed. Rep. of Germany . |
|---|---|---|
| 2628818 | 1/1977 | Fed. Rep. of Germany . |
| 2850561 | 6/1979 | Fed. Rep. of Germany . |
| 3303290 | 8/1983 | Fed. Rep. of Germany . |
| 3401583 | 7/1984 | Fed. Rep. of Germany . |
| 213082 | 8/1984 | Fed. Rep. of Germany . |

OTHER PUBLICATIONS

IBM Technical Disclosure Bulletin, vol. 25, No. 3A, Aug. 1982, pp. 1038-1040.

Primary Examiner—Jerome W. Massie, IV
Assistant Examiner—Matthew Smith
Attorney, Agent, or Firm—Fitzpatrick, Cella, Harper & Scinto

[57] ABSTRACT

A device for feeding a stage in a direction, the device including: first driving system for relatively coarsely feeding the stage, the first driving system having a piston and a cylinder combined in an assembly; locking system for selectively inhibiting relative movement between the piston and the cylinder at least in the aforementioned direction; and second driving system for relatively finely feeding the stage with an aid of the piston and the cylinder.

2 Claims, 5 Drawing Sheets

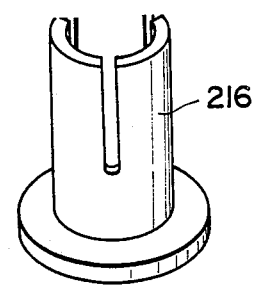
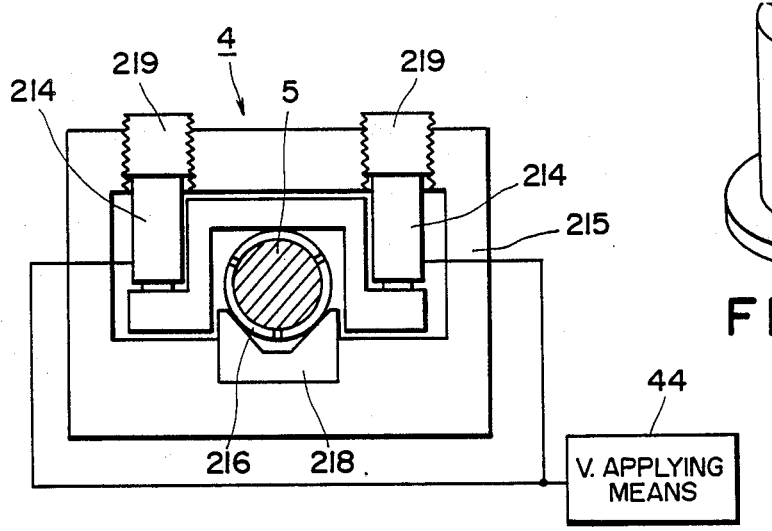
FIG. 7    FIG. 8
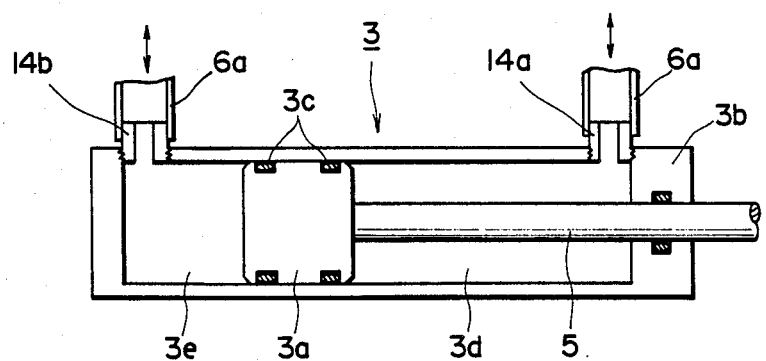
FIG. 9

PRECISE FEEDING MECHANISM

This application is a continuation of application Ser. No. 875,302 filed June 17, 1986, now abandoned.

FIELD OF THE INVENTION AND RELATED ART

This invention relates to a precise feeding mechanism and, more particularly, to a precise feeding mechanism for moving an object through a relatively large stroke and positioning the object with high accuracy. As an example, the feeding mechanism of the present invention can be incorporated into a movable-stage feeding device in an exposure apparatus, testing apparatus, examining apparatus or the like all used in the manufacture of semiconductor devices such as integrated circuits, large scale integrated circuits, etc.

Manufacture of semiconductor devices described above involves use of various manufacturing apparatuses for forming, testing or examining fine patterns such as large scale integrated circuit patterns. Representative of such an apparatus is a pattern printing exposure apparatus which uses light, electron beams or X-rays. In these semiconductor device manufacturing apparatuses, a semiconductor wafer which is a workpiece and/or a mask or reticle which is prepared for the sake of pattern transfer, is held by a movable stage and is precisely positioned by rectilinearly feeding the stage. In a device for feeding such a movable stage, a relatively large stroke of movement is required. For this reason, the stage feeding device is generally provided with a feeding mechanism which is adapted to effect coarse feeding for feeding the stage to a position in the vicinity of a target or aimed stop position at a higher speed but with lower positioning accuracy, and to effect fine feeding for feeding the coarsely positioned stage to the aimed stop position with high accuracy. FIGS. 1 and 2 show prevailing examples of such stage feeding devices, in which FIG. 1 shows a double-shaft feed screw type feeding device and FIG. 2 shows a single-shaft differential feed screw type feeding device.

In the double-shaft feed screw type shown in FIG. 1, a table 404 is rectilinearly movably supported by guide rails 402 mounted on a base 401, by use of guide bearings 403. A coarse-movement feed screw 406 which is supported by the base 401 by means of a bearing unit 405 is in mesh-engagement with a feed nut 407 of the table 404, and the feed screw 406 is rotationally driven by a coarse feeding drive motor 408. Further, additional guide rails 409 are mounted on the table 404, by which guide rails a stage 411 is rectilinearly movably supported with the aid of guide bearings 410. A fine-movement feed screw 413 which is supported by the table 404 by way of a bearing unit 412 is in mesh-engagement with a feed nut of the stage 411, and the feed screw 413 is rotationally driven by a fine-feeding drive motor 415. By such double-shaft feed screw structure using two feed screws 406 and 413, coarse and fine movements of the stage 411 are achieved.

In the single-shaft differential feed screw type shown in FIG. 2, on the other hand, a stage 504 is rectilinearly movably supported by guide rails 502 mounted on a base 501 and by way of guide bearings 503. A feed shaft 505 which is supported by the base 501 by means of unshown bearings is formed with feed screw portions 506 and 507 having a minute difference in their respective "leads". One (506) of the feed screw portions is in mesh-engagement with a feed nut 508 of the stage 504, while the other feed screw portion 507 is in mesh-engagement with a differential nut 510 which is adapted to be selectively made immovable with respect to one of the base 501 and the feeding shaft 505, under the influence of an changeover clutch means 509. The feeding shaft 505 can be rotated by a drive motor 511 which is movable only in the direction of the axis of the feeding shaft 505 with the aid of unshown guide means. When the differential nut 510 is fixedly coupled to the feeding shaft 505 under the influence of the clutch device 509, the nut 510 within the clutch device becomes freely rotatable relative to the base. As a result, each complete revolution of the motor 511 causes fast feeding of the stage 504 by an amount corresponding to the lead of the threads of the feed screw portion 506. When, on the other hand, the differential nut 510 is fixed to the base 501 under the influence of the clutch means 509, each complete revolution of the motor causes movement of the feeding shaft 505, together with the motor, in the opposite direction and by an amount corresponding to the lead of the threads of the feed screw portion 507. As a result, per one revolution of the motor 511, the stage 504 is fed minutely by an amount corresponding to the difference in lead between the feed screw portions 506 and 507.

These conventional devices however involve some disadvantages. That is, in the devices shown in FIGS. 1 and 2, the center of gravity of the stage is not located on the central axis of the feed screw. In other words, the center of gravity of the stage is not located on the line of action of force. This results in that, when the base is disposed vertically (i.e. the stage is to be moved in a vertical plane), overhang load is imposed on the guide bearings which causes undesirable rotational moment to be applied between the guide rails and the guide bearings. This damages the life of the bearings as well as the guiding accuracy. In addition, if it is necessary to dispose the stage in a vacuum, there is a possibility of seizing of the feed screw or the guide bearings due to evaporation of a lubricant oil used. Also, the motor must be made vacuum-resistive. If, to obviate such problems, the motor and the feed screw mechanism whose structure is so complicated that vacuum sealing by convenient bellows or the like is diffucult to achieve, are disposed out of the vacuum chamber and a drive transmitting mechanism is used so as to transmit the movement of the feed screw to the stage guidingly supported in the vacuum chamber by means of the guide rails, the necessity of locating the coarse-movement feed screw mechanism and the fine-movement feed screw mechanism out of the vacuum chamber leads to a necessity of a large space, outside the chamber, which is greater than the total length of the required stroke of the stage.

SUMMARY OF THE INVENTION

It is accordingly a primary object of the present invention to provide a stage feeding device having a structure by which the center of gravity of a stage can be located on the line of action of force.

It is another object of the present invention to provide a stage feeding device having a structure by which at least a coarse-movement feeding mechanism portion can be disposed within a vacuum chamber without causing the above-described problems such as seizing or the like.

It is a third object of the present invention to provide a stage feeding device having a simple structure and high positioning accuracy, with the portion protruding from the vacuum chamber being held compact.

It is a fourth object of the present invention to provide a stage feeding device having a structure which avoids a necessity of flexible-tube piping for the sake of supply/exhaustion of operating fluid into/from a fluid-operated cylinder means.

Briefly, according to one aspect of the present invention, there is provided a device for feeding a stage in a direction, said device comprising: first driving means for relatively coarsely feeding the stage, said first driving means having a piston and a cylinder combined in an assembly; locking means for selectively inhibiting relative movement between said piston and said cylinder at least in said direction; and second driving means for relatively finely feeding the stage with an aid of said piston and said cylinder.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a front elevational view showing a further form of clamping means.

FIG. 8 is a perspective view showing a major component of the clamping means of FIG. 7.

FIG. 9 is a sectional view of a combined piston and cylinder assembly used in the embodiment of FIG. 3.

DESCRIPTION OF THE PREFERRED EMBODIMENTS

Figure 1:
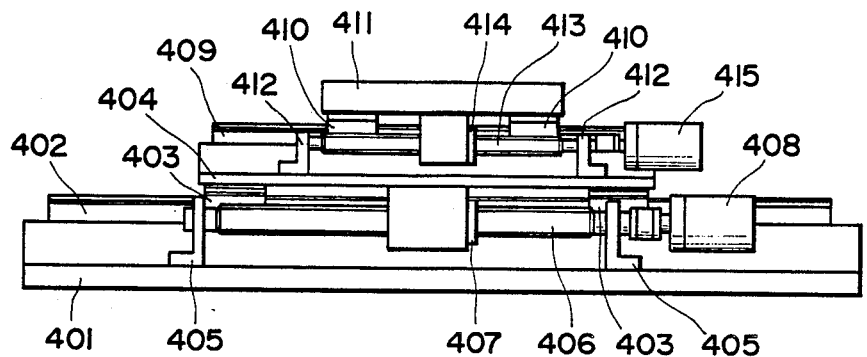
FIG. 1 is a side view schematically showing an example of stage feeding device.
Figure 2:
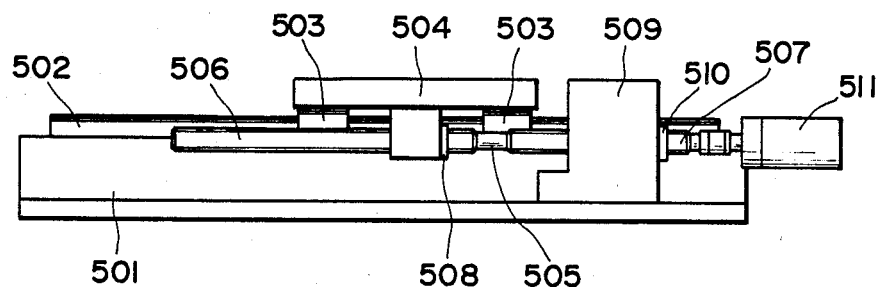
FIG. 2 is a view similar to FIG. 1 but showing another example of conventional stage feeding device.

The stage feeding device according to the present invention includes, in one form, coarse-movement feeding means, fine-movement feeding means and clamping means. The coarse-movement feeding means comprises a combined piston and cylinder assembly which is adapted to rectilinearly move the stage at a higher speed and through a relatively large stroke under the influence of supply/exhaustion of fluid pressure. The clamping means is arranged to selectively lock or inhibit relative movement between a piston and a cylinder of the piston-cylinder assembly of the coarse-movement feeding means. The fine-movement feeding means comprises a feed screw mechanism adapted to rectilinearly move the stage at a lower speed and through a required stroke with the aid of the piston-cylinder assembly that is in a state in which it is locked by the clamping means.

The piston-cylinder assembly is disposed between the stage and the feed screw mechanism. In one preferred form the piston of the piston-cylinder assembly is fixedly coupled to the feed screw mechanism while the cylinder thereof is fixedly coupled to the stage. In another preferred form, the piston and the cylinder are fixedly coupled to the stage and the feed screw mechanism, respectively.

The clamping means is adapted to allow, upon the coarse-movement feeding, the relative movement between the piston and the cylinder, that is the normal operation of the piston-cylinder assembly under the influence of the fluid pressure. Upon fine-movement feeding, on the other hand, the clamping means is effective to make the piston and the cylinder immovable relative to each other such that the piston-cylinder assembly functions merely to transmit drive of the feed screw mechanism for the sake of stage fine movement.

In the stage feeding device according to the above-described preferred form of the present invention, the coarse-movement feeding means is provided by a combined piston and cylinder assembly. This assures that the coarse-movement feeding means is disposed within the stage itself and particularly on a central axis which extends through the center of gravity of the stage, without making the structure complicated. Also, the coarse-movement feeding means can easily be disposed within a vacuum chamber, since all the components such as a piston rod, clamping members, guide rails and so on are of simple structure so that the vacuum sealing therefor is easily attainable by, for example, use of bellows or the like. This in turn allows that the coarse-movement feeding means, which plays a role of moving the stage through almost all the stroke of the feeding device, is disposed within the chamber so that the feed screw mechanism for the fine-movement feeding may be disposed outside the chamber. Consequently, the portion of the feeding device to be located outside the chamber can be made compact. Further, the combined piston and cylinder assembly constituting an actuator for the coarse-movement feeding, itself, is of simple structure as compared with a feed screw type feeding mechanism. Nevertheless, high positioning accuracy can be retained because the final positioning of the stage aiming at the desired or target stop position is achieved by the high-accuracy feed screw mechanism of the fine-movement feeding means.

Figure 3:
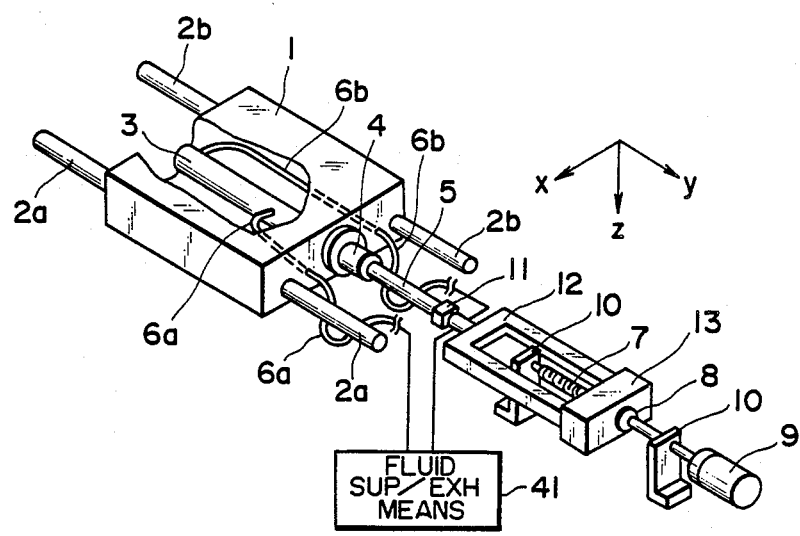
FIG. 3 is a partially broken-away perspective view showing a stage feeding device according to one embodiment of the present invention.

Referring now to FIG. 3, there is shown a stage feeding device according to one embodiment of the present invention.

In this embodiment, a stage 1 for carrying thereon a semiconductor wafer or the like is guidingly supported by linear guide shafts 2a and 2b for rectilinear movement in the direction of y-axis. Disposed within the stage 1 is a combined piston and cylinder assembly 3 whose cylinder side is connected to the stage 1. The assembly 3 constitutes coarse-movement feeding means for the stage 1 and is adapted to move the stage 1 relative to a piston rod 5 of the assembly 3 under the influence of a fluid pressure supplied to or exhausted from its cylinder by fluid supplying/exhausting means 41 and by way of flexible tubes 6a and 6b. Fixedly mounted on the stage 1 is a clamping device 4 having a throughbore in which the piston rod 5 is slidably fitted. The clamping device 4 is arranged to lock the stage 1 after completion of the coarse positioning by the coarse-movement feeding with the assembly 3, that is to selectively lock the stage 1 and the piston rod 5 with each other. To the free end of the piston rod 5, a fine-movement feeding rod 12 having a forked portion is coupled by means of a spherical joint 11. The forked portion of the rod 12 has ends which are fixedly secured to a housing block 13 having a fine-moving feed nut 8. The feed nut 8 is made immovable relative to the housing block 13 by a suitable means and is in mesh-engagement with a fine-moving feed screw 7 supported by a bearing unit 10. A driving motor 9 has a driving shaft which is connected to the feed screw 7, such that rotation of the driving shaft of the motor 9 rotates the feed screw 7, and the rotation of the feed screw 7 causes fine movement of the piston rod 5 with the aid of the forked rod 12 and the joint 11.

Figure 4:
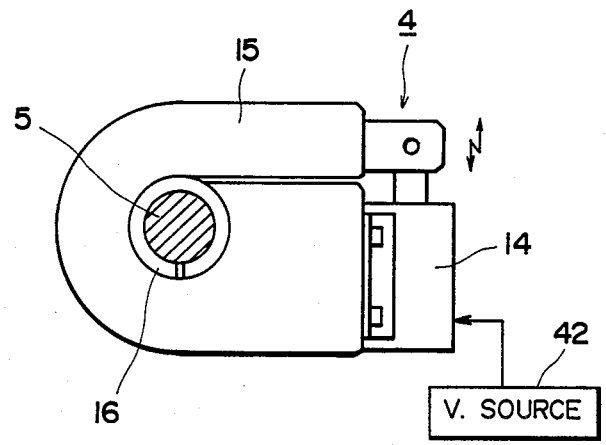
FIG. 4 is a front elevational view showing a form of clamping means used in the embodiment of FIG. 3.

FIG. 4 shows details of the clamping device 4. In this embodiment, the device is an electromagnetic clamping device which comprises a solenoid actuator 14, a resilient chuck 15 and a uniformly fastening grooved or split bushing 16 loosely fitted on the outer periphery of the piston rod 5. The bushing 16 has a substantially C-shape in cross-section and functions as a brake shoe for uniformly applying a braking force to the piston rod 5. The chucking member 15 is operative under the influence of the solenoid actuator 14 to reduce the diameter of the bushing 16 thereby to apply a braking or fastening force to the piston rod 5. The chucking member when it is in its inoperative mode releases the diameter-reducing force to the bushing 16, this being effected by the resiliency of the chucking member itself.

When, in the clamping device 4, the solenoid actuator 14 is deactivated, the piston rod 5 is made freely slidable within the bushing 16. When, on the other hand, the solenoid 14 is activated by means of a voltage source 42, the resilient chuck 15 operates to reduce the diameter of the bushing 16 with the result that the piston rod 5 is fastened tightly. The diameter-reducing force applied to the bushing 16 from the chucking member 15 causes substantially uniform friction clamping force which is applied to the whole periphery of the piston rod. As a result, the piston rod 5 is fastened by a uniformly distributed clamping force and, whereby, undesirable damage of the piston rod 5 is prevented.

In the stage feeding device of the present embodiment described hereinbefore, and in order that the coarse-movement feeding of the stage 1 is to be effected, the driving motor 9 may be preparatorily locked, as an example, by a known servo-locking method, so as to prevent rotational movement of the feed screw 7 relative to the feed nut 8 which is made unrotatable relative to the housing block 13 by suitable means. By doing so, the piston rod 5 can be held immovable at a particular position assumed at that time. Thereafter, the fluid pressure (e.g., of an order of 5–7 kgf/cm$^2$) is supplied into and/or exhausted from the piston-cylinder assembly 3 by way of the tubes 6a and 6b. By this, the cylinder side of the assembly 3, i.e. the stage 1 connected thereto, is moved forwardly or backwardly such that the coarse feeding of the stage 1 through a desired stroke is effected. When the stage 1 reaches a position which is within a predetermined range of tolerance set for the coarse positioning and which is in the vicinity of the desired stop position (target position), the solenoid actuator 14 of the clamping device 4 is activated to stop the movement of the stage 1. By this, the coarse positioning of the stage 1 is completed.

Subsequently, the fine feeding is effected. For this purpose, the clamping device 4 is maintained in its operative state in which the solenoid actuator 14 is held activated. Then, the motor 9 is driven so as to rotate the feed screw 7 by a desired number of revolutions. At this time, the feed nut 8 is retained in a fixedly secured relation with the housing block 13. Therefore, each complete revolution of the feed screw 7 causes feeding movement of the housing block 13 by an amount corresponding to the lead of the screw 7. This movement of the block 13 is transmitted to the piston rod 5 and to the clamping device 4 by way of the rod 12 and the joint 11, such that the stage 1 is fed finely. The above-described changeover from the coarse-movement feeding to the fine-movement feeding, including the energization of the solenoid actuator 14, is controlled in response to instruction signals supplied from an unshown central processing unit (CPU).

In the embodiment of FIG. 3, the piston rod 5, the feeding unit including the forked rod 12, housing block 13 and feed nut 8, and the feed screw 7 are all disposed "coaxially". And, on the axis of such coaxial arrangement, the center of gravity of the stage 1 is located. Furthermore, the central axes of these "coaxial" components including the guide shafts 2a and 2b are all disposed substantially in the same plane. In other words, according to the present structure, the line of action of force can extend through the center of gravity of the stage 1. As a result, even if the stage 1 is disposed vertically (to be displaced in a vertical plane), an unwanted rotational moment to be caused by the overhang load and which might be applied to the guide shafts and their bearings can be minimized.

Moreover, the arrangement of the stage feeding device of the present embodiment facilitates introduction of the feeding device into a vacuum chamber. That is, the device can easily be disposed in the vacuum chamber, e.g., merely by such modification that a slow evaporation type lubricant oil is used for the guide shafts 2a and 2b; that the sliding surface of the piston rod of the piston-cylinder assembly 3 is made vacuum-sealed; that the portion of the mechanism including the components located at the feed screw side of the joint 11 is disposed out of the vacuum chamber (i.e. in the atmosphere); and that the portion of the mechanism including the components located at the stage 1 side of the piston rod 5 is disposed within the vacuum chamber. If so arranged, almost all the components which are contributable to effect the coarse-movement feeding are accommodated in the vacuum chamber. Therefore, the portion of the device protruding out of the chamber can be made very compact.

Figure 5:
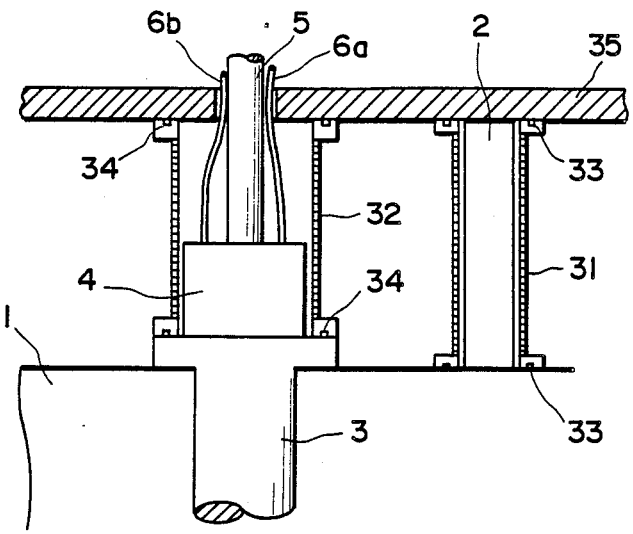
FIG. 5 is a sectional view showing a form of vacuum sealing for a major portion of a stage feedin device according to an embodiment of the present invention.

Additionally, in a case where the guide shafts 2a and 2b, clamping device 4, piston rod 5 and tubes 6a and 6b (when all of which are introduced into the vacuum chamber) are made vacuum-sealed by use of bellows 31 and 32 and O-rings 33 and 34, such as shown in FIG. 5, unpreferable evaporation of the lubricating oil can be prevented effectively. Thus, only by the addition of these simple vacuum-sealing elements, the feeding device can be made into one which is very suitable for use in a high-vacuum chamber.

Figure 6:
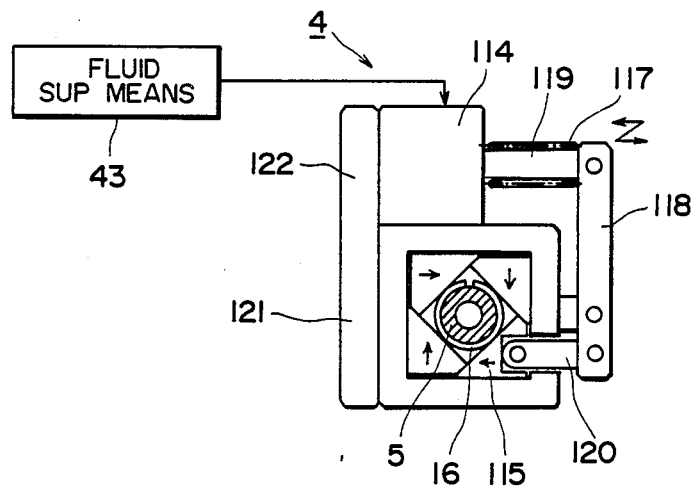
FIG. 6 is a front elevational view showing another form of clamping means.

FIG. 6 shows another form of the clamping device 4. In this example, the device 4 is provided by a spring type clamping device which comprises a disk cylinder assembly 114 of single positive motion type, a universal chuck assembly 115, a compression spring 117 and a bushing 16 which is similar to that shown in FIG. 4. The disk cylinder assembly 114 functions as a driving means for releasing the clamping force, as will be described later. The chucking assembly 115 includes four elongated chucking members each having a quadrilateral shape in cross-section, such as shown in FIG. 6. The chucking members of the assembly 115 are arranged to operate to reduce the diameter of the bushing 16 with the biasing force of the spring 117 applied thereto by way of a lever 118 and a pressing shaft 120. The chucking assembly 115 is also arranged to operate to release, against the biasing force of the spring 117, the diameter-reducing force to the bush 16 when the disk cylinder assembly 114 is operated. Denoted by numeral 119 is a rod of the disk cylinder assembly 114, which is coupled to one end of the lever 118 and around which the spring 117 is loosely mounted. The other end of the lever 118 is coupled to an end of the pressing shaft 120, and the other end of the pressing shaft 120 is coupled to the universal chucking assembly 115. Denoted by numeral 121 is a housing for accommodating the chucking members of the assembly 115. All the above-described components are supported by a common base 122. When, in operation, fluid pressure is supplied to the disk cylinder assembly 114 from a fluid supplying means 43, the disk cylinder assembly 114 produces a clamp releasing force to shift the rod 119 leftwardly as viewed in FIG. 6 and thereby to compress the spring 117. By this, the clamping force is released so that the piston rod 5 is made freely slidable within the bush 16. When, on the other hand, the supply of fluid pressure to the disk cylinder assembly 114 is intercepted the biasing force (or returning force) of the spring 117 becomes effective to shift the rod 119 rightwardly as viewed in FIG. 6, so that the lever 118 is moved clockwise. The clockwise movement of the lever 118 causes leftward movement of the pressing shaft 120, which in turn causes minute displacements of the chucking members of the assembly 115 in the directions as denoted by arrows in FIG. 6, respectively. In other words, the chucking members are moved substantially clockwise as viewed in FIG. 6. By such movements of the chucking members, the diameter of the bushing 16 is reduced, whereby the piston rod 5 is fastened.

In this example, the housing member 121 by which the chucking members of the assembly 115 are movably retained, is supported, by way of the base 122, by the cylinder of the piston-cylinder assembly (FIG. 3) for relative movement in radial directions with respect to the cylinder, i.e. in directions perpendicular to the axis of the piston-cylinder assembly 3. With this arrangement, the diameter-reducing force of the chucking assembly 115 applied to the bushing 16 causes a friction clamping force uniformly distributed over the entire periphery of the piston rod 5, such that the piston rod 5 is fastened by a uniformly distributed clamping force. More particularly, the clamping force to the piston rod 5 acts as a centripetal force to the piston rod 5. And, the housing member 121 (base 122) is able to displace in any radial direction with respect to the cylinder, following the clamping action of the chucking members. This assures prevention of undesirable application of deviating loads to the piston rod 5 at the time of clamping. As a result, the clamping accuracy (the precision of holding the rod 5 at a desired position) can be improved significantly. Also, unwanted damage of the piston rod 5 is avoided. Furthermore, in this example, it is not necessary to supply the fluid pressure to the disk cylinder assembly 114 at the time of clamping. Therefore, consumption of energy to be supplied from the exterior of the device can be reduced. Also, heat generation in the clamping device is prevented, and the life of the device can be prolonged.

FIG. 7 shows still another form of the clamping device 4. In this example, the clamping device comprises a resilient or spring member 216 of substantially cylindrical shape, piezoelectric devices 214 and a clamping unit including a pressing block 217 and a force-dividing V-block 218. The cylindrical member 216 is loosely fitted on the piston rod 5 and has its end portion split into three. The clamping unit is adapted to reduce the diameter of the split portion of the cylindrical member 216 with the aid of the extension of the piezoelectric devices 214 when electric voltages are applied thereto from a voltage applying means 44. More particularly, these components are accommodated in a housing member 215 which is support by the cylinder of the piston-cylinder assembly 3 (FIG. 3) for relative movement in radial directions with respect to the cylinder (i.e. in the directions perpendicular to the axis of the cylinder) by use of suitable resilient means, for example. The piezoelectric devices 214 are supported by the housing member 215 by way of position adjusting screws 219. Details of the cylindrical member 216 are shown in FIG. 8.

When, in the clamping device 4 of the present example, the piezoelectric devices 214 are not energized, the piston rod 5 is freely slidable within the cylindrical member 216. When, on the other hand, the piezoelectric devices 214 are energized by the application of the voltages from the voltage applying means 44, each of the piezoelectric devices 214 extends or expands by an amount of an order of several to several tens of microns. By this, the cylindrical member 213 is pressed between the pressing block 217 and the V-block 218 in three directions. As a result, the diameter of the split portion of the cylindrical member 216 is reduced to fasten the rod 5. At this time, the diameter-reducing force due to the extension of the piezoelectric devices 214 causes friction clamping forces acting in three directions from the blocks 217 and 218 to the center of the rod 5. Thus, the fastening force acts as a centripetal force to the piston rod. And, in this example, the housing member 215 is able to displace in any radial direction with respect to the cylinder, following the clamping action of the clamping unit. This assures prevention of undesirable application of deviating loads to the piston rod 5 at the time of clamping thereof. As a result, the clamping accuracy can be improved and, in addition thereto, unwanted damage of the piston rod 5 is prevented. The piezoelectric device is compact and light in weight, nevertheless it produces a sufficient force. Therefore, the clamping device 4 of the present example can be very compact and, nevertheless, it produces a sufficiently large clamping force.

FIG. 9 is a sectional view schematically showing an internal structure of the piston-cylinder assembly 3 of the stage feeding device of the FIG. 3 embodiment. As shown in FIG. 9, the assembly 3 includes a piston 3a which is connected to an end of the piston rod 5. The piston 3a is slidably movable within the cylinder denoted by numeral 3b. Seal rings 3c are provided on the piston 3a, such that, by the piston 3a, the interior of the piston 3b is separated into two cylinder chambers 3d and 3e. Nipples 14a and 14b are mounted on the opposite end portions of the cylinder 3b so as to supply and-/or exhaust the operating fluids into and/or from the cylinder chambers 3d and 3e.

Figure 10:
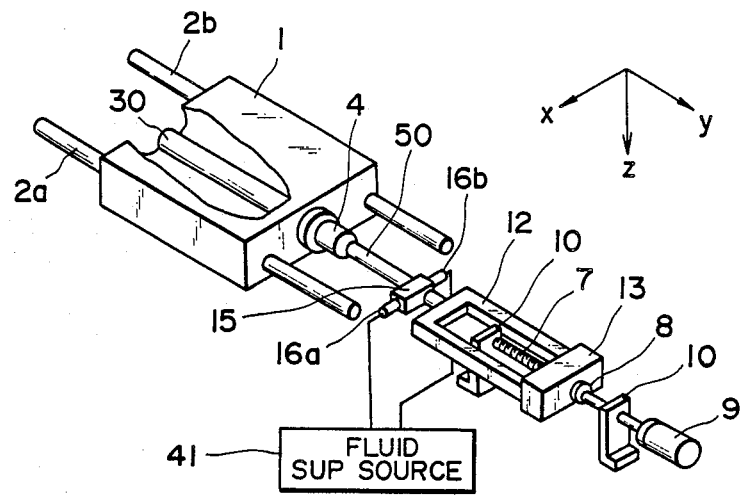
FIG. 10 is a partially broken-away perspective view showing a stage feeding device according to another embodiment of the present invention.
Figure 11:
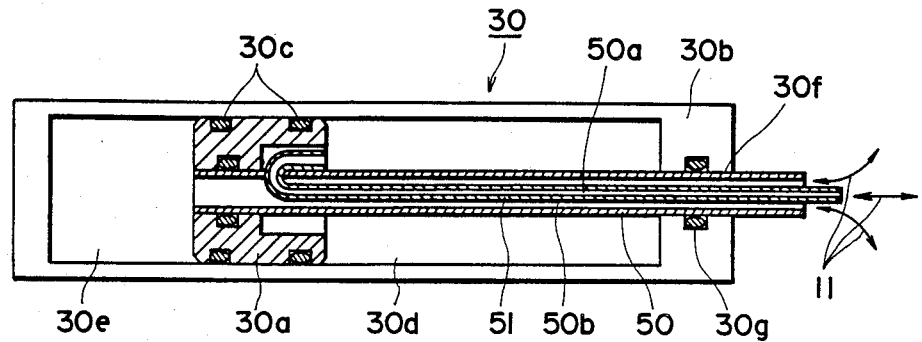
FIG. 11 is a sectional view showing a combined piston and cylinder assembly which is a major component of the FIG. 10 embodiment.
Figure 12:
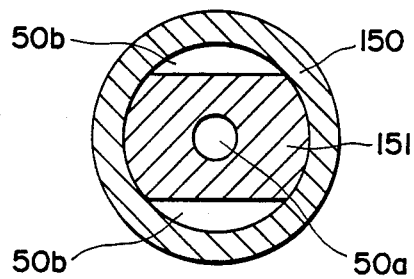
FIG. 12 is a cross-sectional view showing an internal a piston rod used in a stage feeding device according to another embodiment of the present invention.

Referring now to FIGS. 10–12, a stage feeding device according to another embodiment of the present invention will be described.

The present embodiment is similar to the FIG. 3 embodiment, and in FIG. 10 the same reference numerals as those in FIG. 3 are assigned to elements having similar or corresponding functions as of those of the FIG. 3 embodiment. A major distinction of the present embodiment lies in use of a combined piston and cylinder assembly denoted generally by numeral 30 in FIGS. 10 and 11. As shown in FIG. 10, the stage 1 is guidingly supported by linear guide shafts 2a and 2b for rectilinear movement in the direction of the y-axis. The piston and cylinder assembly 30 is disposed within the stage 1 and has a structure generally depicted in FIG. 11. The cylinder side of he assembly 30 is fixedly secured to the stage 1. As shown in FIG. 11, the assembly 30 includes a piston 30a, a cylinder 30b and a piston rod 50 which has an end connected to the piston 30a and which extends through a throughbore 30f formed in the cylinder 30b. Except for the above-described throughbore 30f, the cylinder 30b is not provided with any hole or opening which opens to the exterior of the cylinder 30b. The piston rod 50 is provided by a hollow shaft-like member having open ends. The interior of the piston rod 50 defines an operating fluid supplying/exhausting passage 50b for supplying/exhausting fluid pressure into/from a cylinder chamber 30e defined at the cylinder head side. Fixedly mounted within the hollow piston rod 50 is a small-diameter pipe 51 whose bore defines an operating fluid supplying/exhausting passage 50a for supplying-/exhausting fluid pressure into/from another cylinder chamber 30d defined at the piston rod side of the cylinder 30b. The passages 50a and 50b thus formed in the piston rod 50 are made in fluid-communication with respective nipples 16a and 16b fitted on a joint 15 mounted on the end of the piston rod 50. The nipples 16a and 16b are, in turn, made in fluid-communication with a common fluid pressure supplying source 41.

The piston-cylinder assembly 30 constitutes coarse-movement feeding means for the stage 1. That is, under the influence of the fluid pressure to be supplied thereinto or exhausted therefrom by way of the passages 50a and 50b in the piston rod 50, the assembly 30 move the stage 1 relative to the piston rod 50. The stage 1 has a clamping device 4 which is fixedly secured to the stage 1 and encircles the piston rod 50. As in the FIG. 3 embodiment, the clamping device 4 of the present embodiment is adapted to lock the stage 1 after completion of the coarse positioning at the end of the coarse-movement feeding by the assembly 30. That is, the clamping device 4 selectively locks or clamps the relative movement between the stage 1 and the piston rod 5. To the end of the piston rod 5, a fine-motion feed rod 12 having a forked portion is coupled by way of the joint 15. The free ends of the forked portion of the rod 12 are fixedly secured to a housing block 13 having a fine-motion feed nut 8. The nut 8 is made immovable relative to the housing block 13 by a suitable means and is in mesh-engagement with a fine-motion feed screw 7 rotatably supported by a bearing unit 10. An end of the feed screw 7 is coupled to an output shaft of a driving motor 9, such that the drive of the motor 9 rotates the feed screw 7. And, the rotation of the feed screw 7 causes fine rectilinear movement of the piston rod 50 with the aid of the feed nut 8, housing block 13, forked rod 12 and joint 15.

The operation of the stage feeding device of the present embodiment, i.e. the coarse feeding and fine feeding of the stage 1, is essentially the same as that of the FIG. 3 embodiment.

In the present embodiment, the pipe 51 provided in the piston rod 50 is preferably fixed within the rod 50. By this fixation, unpreferable vibration of the pipe 51 in the rod 50 is prevented.

FIG. 12 shows an example of fixation of the pipe 51. More particularly, as shown in FIG. 12, the piston rod is provided by a hollow shaft-like member 150 having a bore in which another hollow shaft-like member 151 is fitted. The shaft-like member 151 has an external diameter so selected that the shaft-like member 151 is closely fitted in the bore of the hollow shaft-like member 150. Also, outer portions of the shaft-like member 151 are partially cut away along the entire length thereof, as seen from FIG. 12. Thus, the bore of the shaft-like member 151 provides a passage 50a corresponding to the passage 50a shown in FIG. 11, while the cut-away portions provide passages 50b corresponding to the passage 50b shown in FIG. 11. Also, in the example shown in FIG. 12, the hollow shaft-like member 151 is closely or tightly fitted in the bore of the piston rod 150. Thus, unwanted vibration of the inner pipe within the outer pipe is completely prevented.

While, in the foregoing, the present invention has been described with reference to embodiments in which the piston-cylinder assembly 3 or 30 for moving the stage 1 is driven by use of a fluid pressure (pressurized fluid), air pressure may of course be used as the fluid pressure. Also, if the load of the stage is not so large and the required feeding speed is not so high, the assembly 3 or 30 may be driven by evacuation or vacuum-actuation. That is, one of the fluid supplying/exhausting passages of the above-described embodiments may be made open to the atmosphere, while the other passage may be connected to a pressure-reducing means so that the pressure in the latter passage is reduced to a level lower than the atmospheric pressure (e.g. within a range of 1 kgf/cm² max.). Particularly, such an arrangement is effective to reduce a leak of fluid pressure at the sealing member 30g (FIG. 11) for the piston rod, when the feeding device is used in a vacuum chamber.

While the invention has been described with reference to the structures disclosed herein, it is not confined to the details set forth and this application is intended to cover such modifications or changes as many come within the scope of the following claims.

What is claimed is:

1. A device for moving a stage in a predetermined direction, said device comprising:
   a guide for guiding the movement of the stage in said predetermined direction;
   piston means coupled to the stage and having a cylinder and a piston rod, said piston rod being movable relative to said cylinder, said piston means being operable to move the stage along said guide by the relative movement of said piston rod and said cylinder;
   means for locking said cylinder with said piston rod for preventing the relative movement between said cylinder and said piston rod; and
   moving means operable, when the relative movement between said cylinder and said piston rod is prevented by said locking means, to move said piston means to thereby move the stage along said guide.

2. A device according to claim 1, wherein said cylinder of said piston means is coupled to the stage and wherein said piston rod is coupled to said moving means.

* * * * *

UNITED STATES PATENT AND TRADEMARK OFFICE
CERTIFICATE OF CORRECTION

PATENT NO.  : 4,854,444

DATED       : August 8, 1989

INVENTOR(S) : Kazunori Iwamoto

It is certified that error appears in the above-identified patent and that said Letters Patent is hereby corrected as shown below:

Item [30]

"Japan ... 135946" should read --Japan ... 60-135946--.

Item [56]

"213082 8/1984 Fed. Rep. of Germany." should read
-- 213082 8/1984 Dem. Rep. of Germany.--.

COLUMN 1

Line 56, "feed nut" should read --feed nut 414--.

COLUMN 3

Line 37, "feedin" should read --feeding--.

Line 53, "internal" should read --internal structure of --.

UNITED STATES PATENT AND TRADEMARK OFFICE
CERTIFICATE OF CORRECTION

PATENT NO. : 4,854,444

DATED : August 8, 1989

INVENTOR(S) : Kazunori Iwamoto

It is certified that error appears in the above-identified patent and that said Letters Patent is hereby corrected as shown below:

COLUMN 7

Line 32, "bush 16." should read --bushing 16.--.
    Line 34, "intercepted" should read --intercepted,--.

COLUMN 8

Line 21, "support" should read --supported--.
    Line 38, "cylindrical member 213" should read --cylindrical member 216--.

COLUMN 9

Line 19, "he" should read --the--.
    Line 46, "move" should read --moves--.

COLUMN 10

Line 45, "many" should read --may--.

Signed and Sealed this

Seventh Day of August, 1990

Attest:

HARRY F. MANBECK, JR.

*Attesting Officer*    *Commissioner of Patents and Trademarks*